United States Patent [19]

Nozue

[11] Patent Number: 5,759,722

[45] Date of Patent: Jun. 2, 1998

[54] ELECTRON BEAM APERTURE STRUCTURE AND METHOD FOR FABRICATING THE SAME

[75] Inventor: Hiroshi Nozue, Tokyo, Japan

[73] Assignee: NEC Corporation, Tokyo, Japan

[21] Appl. No.: 585,718

[22] Filed: Jan. 16, 1996

[30] Foreign Application Priority Data

Jan. 13, 1995 [JP] Japan ................................ 7-020948

[51] Int. Cl.$^6$ .................................................. G03F 9/00
[52] U.S. Cl. ........................................ 430/5; 430/296
[58] Field of Search ........................ 430/5, 296, 321, 430/311

[56] References Cited

U.S. PATENT DOCUMENTS

| | | | |
|---|---|---|---|
| 4,855,197 | 8/1989 | Zapka et al. | 430/5 |
| 5,279,925 | 1/1994 | Berger et al. | 430/296 |
| 5,593,761 | 1/1997 | Itoh et al. | 430/5 |

FOREIGN PATENT DOCUMENTS

4-137520  5/1992  Japan .
7-169674  7/1995  Japan .

*Primary Examiner*—S. Rosasco
*Attorney, Agent, or Firm*—Sughrue, Mion, Zinn, Macpeak & Seas, PLLC

[57] ABSTRACT

The aperture structure is for cell projection writing of patterns on a semiconductor substrate by an electron beam. The aperture structure includes a wafer, and a plurality of aperture patterns formed in the wafer. The aperture patterns are positioned and structured such that a thermal coefficient of a front side of the wafer and that of a back side of the wafer are the same as each other. The aperture patterns are positioned in a central portion and are symmetrically shaped in the depth direction of the base. For fabricating the aperture structure, the front side of the wafer is etched, or the front side and the back side of the wafer are etched, and the aperture patterns are formed in the etched portion or portions. The back side of the wafer is etched to the same depth as the front side. The aperture structure does not become warped, and the accuracy of generating patterns on a wafer with electron beams is greatly enhanced.

13 Claims, 7 Drawing Sheets

ELECTRON BEAM APERTURE STRUCTURE AND METHOD FOR FABRICATING THE SAME

BACKGROUND OF THE INVENTION (1) Field of the Invention

The present invention relates to an electron beam (EB) aperture structure for use in an EB lithography, and more particularly to a cell projection writing for generating a circuit pattern directly on a semiconductor substrate with an electron beam for forming, for example, a semiconductor integrated circuit thereon.

(2) Description of the Related Art

Recent semiconductor integrated circuit advancement is remarkable, and the storage capacity of memory elements represented by DRAMs is being increased to four times every three years. This advancement is greatly attributable to the advancement of fine processing techniques, particularly of lithographic techniques.

Heretofore, for forming fine patterns on an wafer constituting a semiconductor substrate, a reduced projection exposure device called a "stepper" (step-and-repeat) has used ultraviolet light beam as light source. For transferring finer patterns, the wavelengths of the light source have been reduced to ultra-short wavelengths. Typically, mercury lamp g-rays (436 nm) has been changed to mercury lamp i-rays (365 nm) and further changed to laser beams (249 nm) of KrF eximer laser using krypton fluoride gas.

Although the light source wavelength reduction to ultra-short wavelengths has improved the fine pattern transfer capacity, i.e., the resolution, it has reduced the depth of focus. Accordingly, an EB lithography process which can provide for remarkably improved depth of focus compared to the light beam exposure process is attracting attention.

Although the EB lithography process, with which the semiconductor integrated circuit patterns are generated using a small-spot electron beam by directly writing patterns, permits generating finer patterns, it has a problem that its processing capacity is low compared to the light exposure process.

However, in the EB lithography process, a cell projection EB writing has been developed to replace the above direct EB writing process. For example, the aperture structure disclosed in Japanese Patent Application Kokai Publication No. Hei 4-137520 relates to an aperture structure for use in such a cell projection EB writing process. In this technique, the patterns transferred in a cell projection form are eventually placed together to form the entire circuit pattern. With the development of the cell projection EB writing process, the processing capacity has made great strides.

FIGS. 1A to 1D are sectional views of an aperture structure for use in explaining the fabrication method of the prior art structure.

Figure 1A:
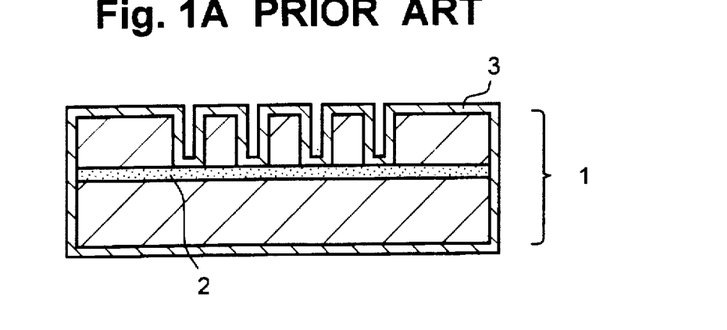
FIGS. 1A to 1D are sectional views of an aperture structure for use in explaining the sequential steps for fabricating a prior art structure.

As shown, a front surface of a (100)-plane silicon bonded wafer 1 is patterned, and a protective film (such as a silicon nitride film) 3 for wet etching is formed by a CVD process on both the front and the back surfaces (See FIG. 1A).

Figure 1B:
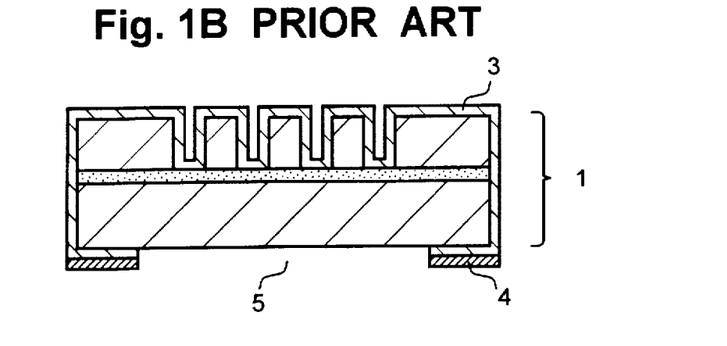

Then, using a resist mask 4 having a window formed by patterning a resist, the protective film 3 is selectively dry-etched to form a window 5 for back-etching (see FIG. 1B).

Figure 1C:
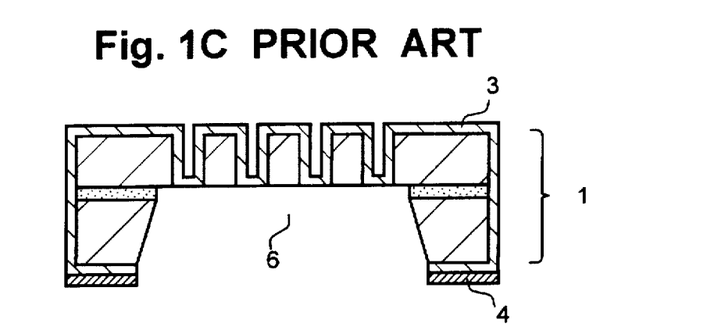
Figure 1D:
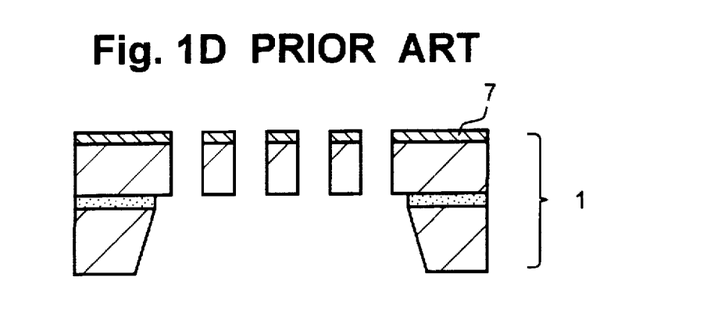

Next, the portion of the silicon wafer 1 exposed by the back-etching window 5 is back-etched, to a bonding layer 2, using a wet-etching solution obtained by heating an alkali solution containing potassium hydroxide, hydrazine, etc., thus forming an opening 6 (see FIG. 1C).

The opening 6 has a taper which is formed with the exposure of the (111)-plane while the wafer is wet-etched. Afterwards, the remaining resist 4 and protective film 3 are removed, and then a conductive layer 7 (of Au, for instance) for preventing charge-up during the electron beam irradiation, is deposited by the sputtering process on the front surface, thus completing the aperture structure (see FIG. 1D).

In the use of this prior art aperture structure, the pattern portion is exposed to the current with an accelerating voltage of 30 to 50 kV and a current density of 10 to 100 A/cm$^2$. The exposed portion is heated to temperatures sometimes exceeding 1,400° C. The conductive layer 7 deposited on the surface also has a role of allowing the heat to dissipate. However, when the conductive layer 7 is made thicker, it is also deposited on side portions of the pattern to reduce the accuracy of the pattern.

Figure 2:
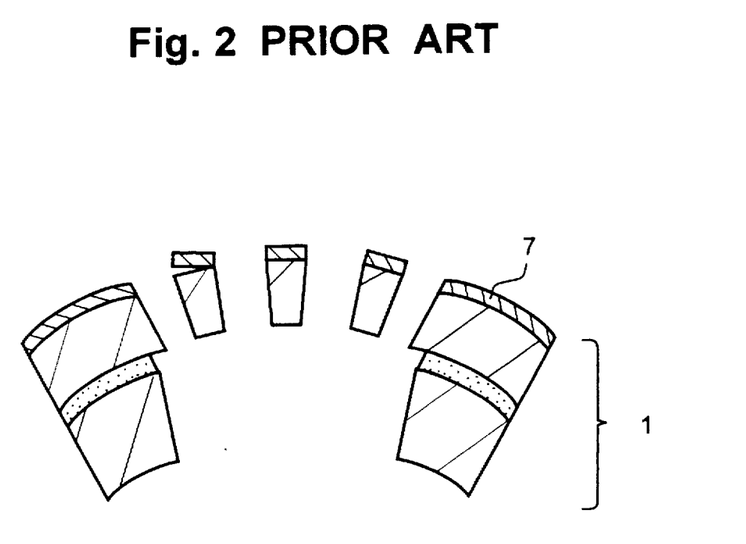
FIG. 2 is a sectional view of the prior art structure in a state wherein a problem has developed during the use thereof.

For this reason, the conductive layer 7 is required to be made thin (approximately 10 nm) and, for this reason, the heat cannot be sufficiently dissipated. Consequently, the aperture structure, when its front surface is heated, is warped due to thermal expansion of the front surface, as shown in FIG. 2.

With the warping of the aperture structure caused in the above way, the accuracy of the aperture pattern is reduced so that the accuracy of the pattern generated on the wafer is greatly affected, thus reducing the production yield of LSI.

A further problem is that irradiation of the front surface of the warped aperture structure results in a bur or separation of the conductive layer 7 (see FIG. 2), and eventually the aperture structure can no longer be used.

SUMMARY OF THE INVENTION

It is an object of the invention, therefore, to overcome the problems existing in the prior art, and to provide an aperture structure which is free from warping when it is irradiated by an electron beam and in which a high accuracy and a long life are ensured, and a fabrication method for the same. These advantages are achieved by arranging that the pattern portion be positioned symmetrically in the central portion in a depth direction (the direction perpendicular to the wafer surface) of the aperture structure.

According to one aspect of the invention, there is provided an aperture structure for cell projection writing of patterns on a semiconductor substrate by an electron beam, the aperture structure comprising:

a wafer;

a plurality of aperture patterns formed in the wafer, the aperture patterns being positioned and structured such that a thermal coefficient of a front side of the wafer and that of a back side of the wafer are the same as each other. In a preferred embodiment, the wafer comprises two bonding layers.

According to another aspect of the invention, there is provided a method for fabricating an aperture structure for cell projection writing of patterns on a semiconductor substrate by an electron beam, the method comprising the sequential steps of:

etching a front side of a wafer;

forming aperture patterns in the etched portion of the wafer; and then etching a back side of the wafer.

According to the invention, the aperture structure is formed by etching a silicon wafer from the front side and also from the back side to form a pattern portion in an intermediate portion of the wafer in the depth direction thereof. It is thus possible to avoid warping of the aperture structure when irradiated by an electron beam. It is also possible to improve the accuracy in generating patterns on the wafer with the electron beam, and permit quality increase and cost reduction of LSI. A further effect obtainable according to the invention is that it is possible to use both sides of the aperture structure and thus greatly extend the life thereof.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings. The following embodiments are described in connection with examples wherein a silicon wafer is used as a substrate.

EMBODIMENT 1

FIGS. 3A to 3H show, in sectional views, a structure for use in explaining sequential steps for fabricating the structure of a first embodiment according to the invention.

Figure 3A:
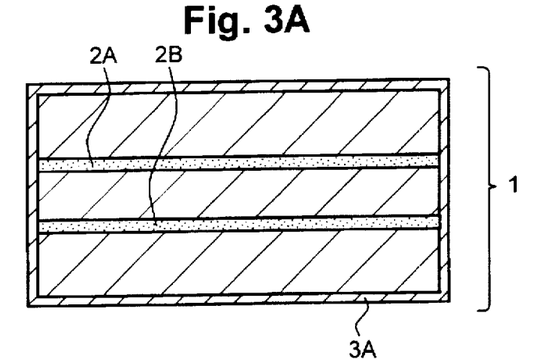
FIGS. 3A to 3H are sectional views of an aperture structure for use in explaining the sequential steps for fabricating the aperture structure of a first embodiment according to the invention.

In this embodiment, the wafer 1 has, unlike in the prior art wherein the single bonding layer wafer is used, two bonding layers 2A and 2B.

The wafer 1 having the two bonding layers has not hitherto been used because of inferior yield of its production. This has been so because of the tendency of generating voids on the bonding surfaces to cause defective wafers. Recently, however, the technique of reducing voids has been greatly improved thereby permitting production of wafer having two bonding layers.

To produce an aperture structure in this embodiment, a protective film (i.e., a silicon nitride film) 3A for wet etching is formed by CVD on the entire surface of the wafer 1 (see FIG. 3A).

Figure 3B:
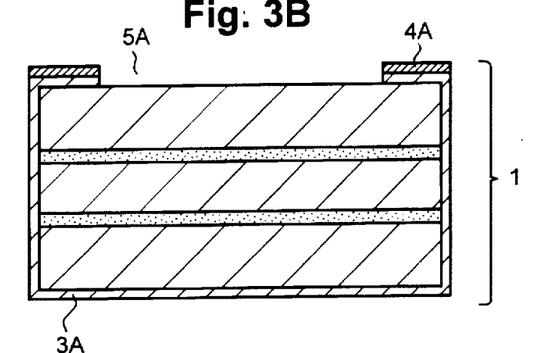

Then, on the front side, the protective film 3A is selectively dry etched using a resist mask 4A with a window formed by patterning a resist (see FIG. 3B).

Figure 3C:
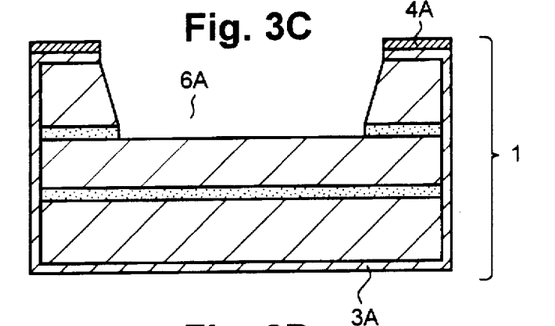

Then, the portion of the wafer 1 exposed by the front side window 5A formed for wet etching, is selectively etched, inclusive of the bonding layer 2A, using a wet-etching solution obtained by heating an alkali solution containing potassium hydroxide, hydrazine, etc., thus forming an opening 6A (see FIG. 3C).

Figure 3D:
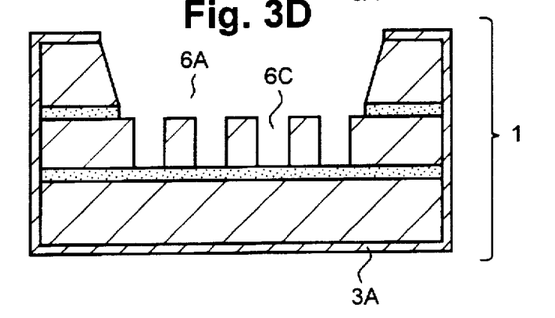

Then, aperture patterns 6C are formed in the bottom of the opening 6A by using lithographic and etching techniques (see FIG. 3D).

Figure 3E:
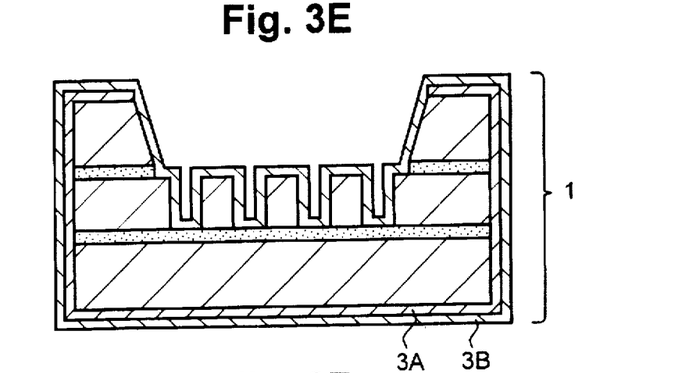

Then, a protective film (for instance a nitride film) 3B for wet etching is formed by CVD over the entire surface (see FIG. 3E).

Figure 3F:
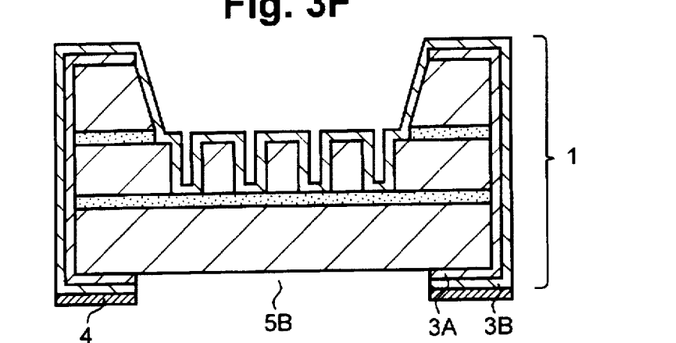

Subsequently, at the back side, the protective film 3B for wet etching is dry etched using a resist mask 4 on the protective film 3B which mask is formed by patterning a resist is formed with a window, thus forming a back-etching window 5B (see FIG. 3F).

Figure 3G:
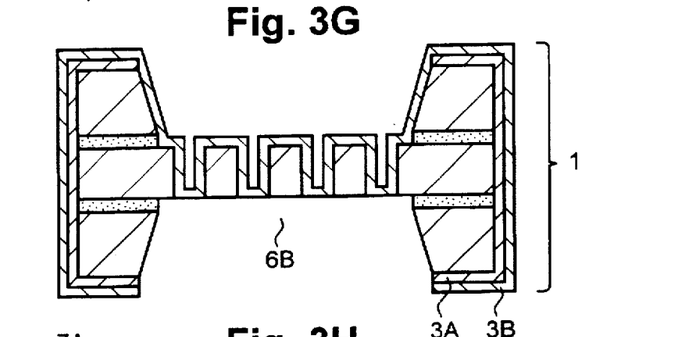
Figure 3H:
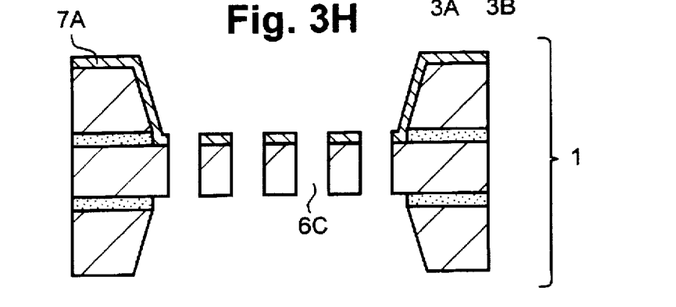

Then, the portion of the wafer 1 exposed by the back-etching window 5B is selectively etched, to the bonding layer 2B, using a wet-etching solution obtained by heating an alkali-etching solution containing potassium hydroxide, hydrazine, etc., thus forming an opening 6B on the back side (see FIG. 3G).

Then, the protective layers 3A and 3B are separated, and then a conductive layer 7A is formed on the front surface by sputtering Au, thus completing the aperture structure. (see FIG. 3H).

Instead of forming the wet-etching protective film 3B on the wet-etching protective film 3A in the step of FIG. 3E in this embodiment, the protective film 3B may be formed after separating the protective film 3A.

The aperture structure (see FIG. 3H) produced in the above way is not warped when it is irradiated by an electron beam from an electron gun because the aperture structure is substantially symmetrical in the depth direction. It is thus possible to obtain accurate patterning on the wafer.

The above advantage results from the arrangement wherein the aperture patterns are positioned and structured such that a thermal coefficient of the front side and that of the back side of the aperture structure are equal.

EMBODIMENT 2

FIGS. 4A to 4H are sectional views of a structure for use in explaining sequential steps for fabricating the structure of a second embodiment according to the invention. The steps of FIGS. 4A to 4C up to the formation of the opening 6A are as in the previous first embodiment (FIGS. 3A to 3C steps), so that they are not described.

Figure 4A:
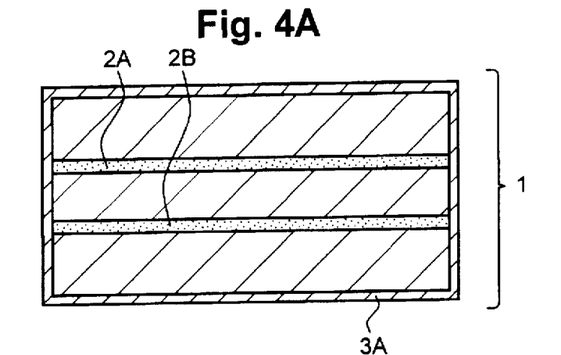
FIGS. 4A to 4H are sectional views of an aperture structure for use in explaining the sequential steps for fabricating the aperture structure of a second embodiment according to the invention.
Figure 4B:
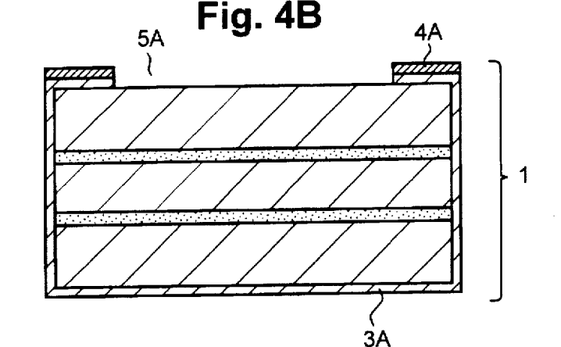
Figure 4C:
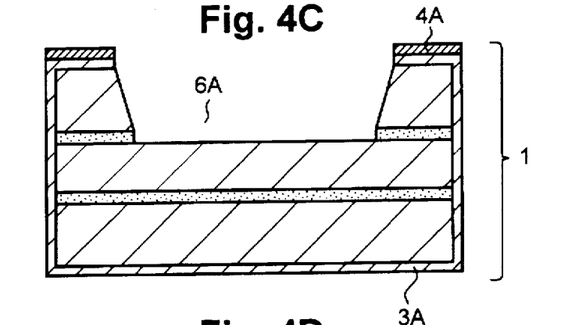
Figure 4D:
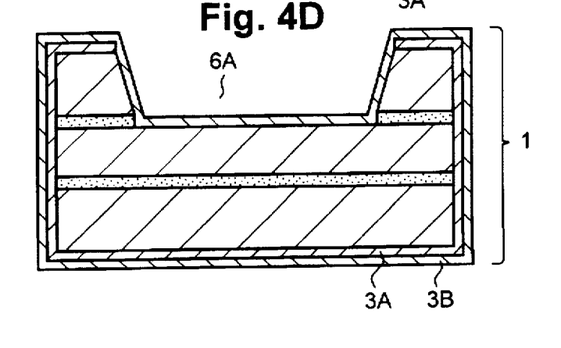

In this embodiment, a protective film 3B for wet-etching is then formed on the entire wafer surface (see FIG. 4D). At this time, the protective film 3A may or may not have been separated. In the instant case, the protective film 3B is formed without separating the protective film 3A.

Figure 4E:
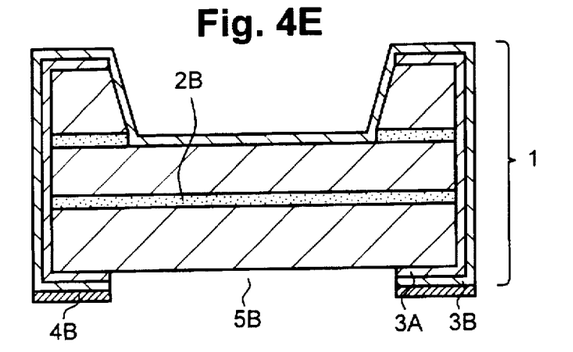
Figure 4F:
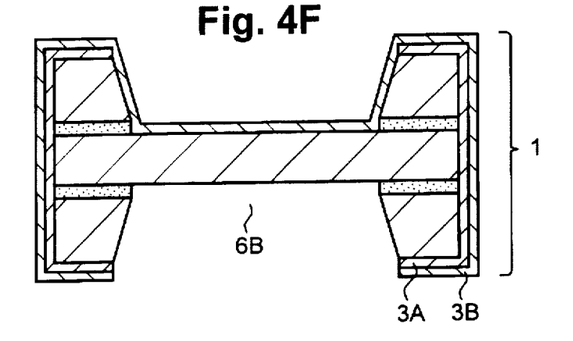

The protective film 3B is selectively dry etched using a resist mask 4B with a window formed by patterning a resist, thus forming a back-etching window 5B (see FIG. 4E). Then, the portion of the wafer 1 exposed by the back-etching window 5B is etched, inclusive of the bonding layer 2B, to form an opening 6B (see FIG. 4F).

Figure 4G:
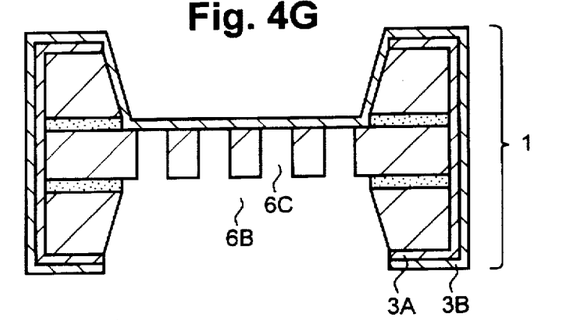
Figure 4H:
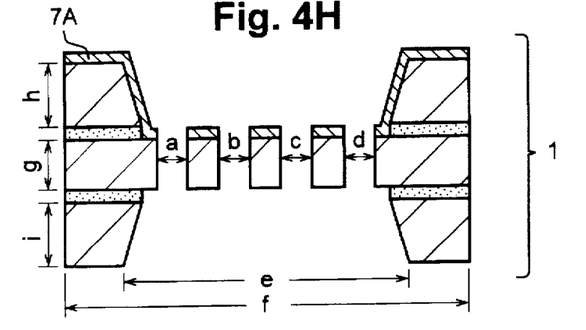

Then, in the remaining silicon portion, aperture patterns 6C are formed by lithography and etching processes (see FIG. 4G) and, finally, the protective films 3A and 3B are separated, and a conductive film 7A is formed, thus completing the aperture structure (see FIG. 4H).

While, in the above embodiment, the etching is made first on the front side and then on the back side, this procedure of etching may be reversed without any problem.

EMBODIMENT 3

Figure 5:
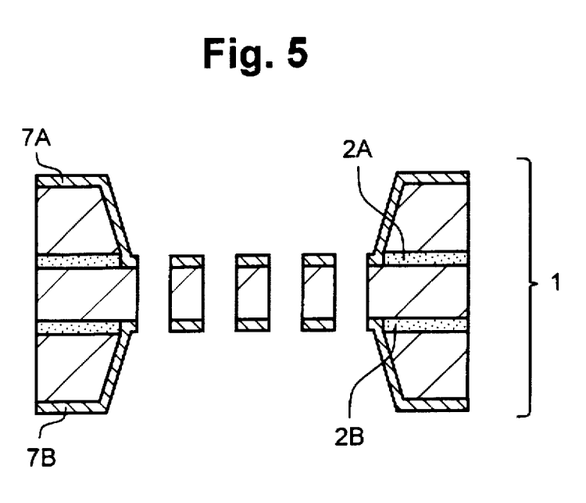
FIG. 5 is a sectional view of an aperture structure of a third embodiment according to the invention.

FIG. 5 is a sectional view for use in describing a third example of aperture structure according to the invention.

While, in the aperture structures in the preceding embodiments 1 and 2, the conductive layer 7A was formed only on the front side, in this third embodiment, conductive layers 7A and 7B are formed on the front and back sides, respectively.

With this arrangement, the capacity of allowing the discharge or the heat dissipation is improved. In addition, when the aperture is damaged or contaminated on the front side, it can still be used by turning it upside down to make the back side as the front side. Thus, its life is substantially doubled, and also its cost can be greatly reduced. Of course, it is free from warping.

Finally, with reference to FIG. 4H, the dimensions of the aperture structures of the first to third embodiments may be given, for example, as follows: Each of a, b, c and d is 2.5–10 µm; e is 125 µm$^\square$, f: 10 mm$^\square$; g is 20 µm; each of h and i is 300.5 µm. Each of $SiO_2$ films interposed between g and h and between g and i is 2 µm thick.

While the invention has been described in its preferred embodiments, it is to be understood that the words which have been used are words of description rather than limitation and that changes within the purview of the appended claims may be made without departing from the true scope of the invention as defined by the claims.

For example, although, in the above embodiments, the wafer employs silicon wafers bonded together, it is not necessary for the wafer to be of bonded wafers or be of silicon wafers as other materials are also available.

Further, the protective film for the wet-etching is not limited to the silicon nitride film, and the conductive layer is not limited to Au.

What is claimed is:

1. An aperture structure for cell projection writing of patterns on a semiconductor substrate by an electron beam, said aperture structure comprising:

a wafer;

a plurality of aperture patterns formed in said wafer, said aperture patterns being positioned and structured such that a thermal coefficient of a front side of said wafer and a thermal coefficient of a back side of said wafer are the same as each other.

2. An aperture structure according to claim 1, in which one of said etched front and back sides of said wafer is covered by a conductive layer.

3. An aperture structure according to claim 1, in which said etched front and back sides of said wafer are covered respectively by conductive layers.

4. An aperture structure according to claim 1, in which said wafer comprises two bonding layers.

5. An aperture structure for cell projection writing of patterns on a semiconductor substrate by an electron beam, said aperture structure comprising:

a wafer;

a plurality of aperture patterns formed in said wafer, said aperture patterns being positioned both on an etched front side and an etched back side of said wafer, and in a central portion in the depth direction of said wafer such that a theremal coefficient of said etched front side and a thermal coefficient of said etched back side of said wafer are the same.

6. An aperture structure for cell projection writing of patterns on a semiconductor substrate by an electron beam, said aperture structure comprising:

a wafer;

a plurality of aperture patterns formed in said wafer, said aperture patterns being provided both at a front side and a back side of said wafer, and positioned in a central portion in the depth direction of said wafer and being substantially in a symmetrical shape in the depth direction of said wafer such that a thermal coefficient of said front side of said wafer and a thermal coefficient of said back side of said wafer are the same.

7. A method for fabricating an aperture structure for cell projection writing of patterns on a semiconductor substrate by an electron beam, said method comprising the sequential steps of:

etching a front side of a wafer;

forming aperture patterns in the etched portion of said wafer; and then etching a back side of said wafer such that a thermal coefficient of said front side of said wafer and a thermal coefficient of said back side of said wafer are the same.

8. A method for fabricating an aperture structure according to claim 7 in which said step of forming is performed such that said aperture patterns are formed in a central portion in a depth direction of said wafer.

9. A method for fabricating an aperture structure for cell projection writing of patterns on a semiconductor substrate by an electron beam, said method comprising the sequential steps of:

etching a front side of a wafer;

etching a back side of said wafer;

forming aperture patterns in the etched portions of said wafer such that a thermal coefficient of said front side of said wafer and a thermal coefficient of said back side of said wafer are the same.

10. A method for fabricating an aperture structure according to claim 9, in which said wafer is silicon wafer.

11. A method for fabricating an aperture structure according to claim 9 in which said step of forming is performed such that said aperture patterns are formed in a central portion in a depth direction of said wafer.

12. A method for fabricating an aperture structure for cell projection writing of patterns on a semiconductor substrate by an electron beam, said method comprising the steps of:

etching a front side of a wafer;

etching a back side of said wafer substantially to the same depth as said front side;

forming aperture patterns in an intermediate layer portion of said wafer such that a thermal coefficient of said front side and a thermal coefficient of said back side are the same; and forming a conductive layer on one of said etched front and back sides of said wafer.

13. A method for fabricating an aperture structure according to claim 9 in which said etching on said front and back sides of said wafer are substantially symmetric to each other in depth.

* * * * *